United States Patent
Liu et al.

(10) Patent No.: US 11,729,927 B2
(45) Date of Patent: Aug. 15, 2023

(54) ELECTRONIC DEVICE AND ROTARY SHAFT MECHANISM THEREOF, AND DEVICE BODY

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Yuhong Liu, Beijing (CN); Zhanshan Ma, Beijing (CN); Jiankang Sun, Beijing (CN); Zheng Ge, Beijing (CN); Lili Chen, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 297 days.

(21) Appl. No.: 17/229,953

(22) Filed: Apr. 14, 2021

(65) Prior Publication Data

US 2022/0124921 A1 Apr. 21, 2022

(30) Foreign Application Priority Data

Oct. 20, 2020 (CN) .......................... 202011122931.0

(51) Int. Cl.
*H05K 5/02* (2006.01)
*H05K 1/02* (2006.01)
*H05K 5/00* (2006.01)

(52) U.S. Cl.
CPC ......... *H05K 5/0217* (2013.01); *H05K 1/0277* (2013.01); *H05K 5/0017* (2013.01); *H05K 5/0086* (2013.01)

(58) Field of Classification Search
None
See application file for complete search history.

(56) References Cited

U.S. PATENT DOCUMENTS

| 2015/0306873 | A1* | 10/2015 | Jo | B41J 2/355 347/50 |
|---|---|---|---|---|
| 2017/0094816 | A1* | 3/2017 | Yun | G02B 27/0176 |
| 2021/0135492 | A1* | 5/2021 | Kim | H02J 50/10 |
| 2021/0231259 | A1* | 7/2021 | Ma | G06F 1/163 |

* cited by examiner

*Primary Examiner* — Krystal Robinson
(74) *Attorney, Agent, or Firm* — Lippes Mathias LLP

(57) ABSTRACT

A rotary shaft mechanism of an electronic is provided. The rotary shaft mechanism includes a first rotating assembly and a second rotating assembly, wherein the first rotating assembly is provided with a first through hole, and the second rotating assembly is provided with a second through hole, wherein the first through hole is in communication with the second through hole, and an axis of the first through hole and an axis of the second through hole are both intersected with a rotary shaft between the first rotating assembly and the second rotating assembly. A flexible circuit board of the electronic device is disposed in the first through hole and the second through hole.

20 Claims, 19 Drawing Sheets

ELECTRONIC DEVICE AND ROTARY SHAFT MECHANISM THEREOF, AND DEVICE BODY

CROSS REFERENCE TO RELATED APPLICATIONS

This application is based on and claims priority to Chinese Patent Application No. 202011122931.0, filed on Oct. 20, 2020 and entitled "ELECTRONIC DEVICE AND ROTARY SHAFT MECHANISM THEREOF," the disclosure of which is incorporated herein by reference in its entirety.

TECHNICAL FIELD

The present disclosure relates to the field of mechanical technologies, and in particular to an electronic device and a rotary shaft mechanism thereof, and a device body.

BACKGROUND

A wearable device of glasses may include a housing for packaging a display screen and two temples. The two temples may be rotatably connected to both ends of the housing respectively.

In the related art, the wearable device of glasses may further include an electronic element, an external circuit board, and a flexible circuit board for connecting the electronic element to the external circuit board. The electronic element may be disposed in the housing, and the external circuit board may be disposed in the temple. The flexible circuit board is disposed outside the housing and the temple. Further, one end of the flexible circuit board is connected to the electronic element, and the other end of the flexible circuit board is connected to the external circuit board. Thus, the external circuit board may supply signals to the electronic element by the flexible circuit board.

SUMMARY

According to embodiments of the present disclosure, an electronic device and a rotary shaft mechanism thereof, and a device body are provided.

In one aspect, embodiments of the present disclosure provide a rotary shaft mechanism of an electronic device. The rotary shaft mechanism includes: a first rotating assembly, disposed in a first body of the electronic device and fixedly connected to the first body; and a second rotating assembly, disposed in a second body of the electronic device and fixedly connected to the second body.

The first rotating assembly is rotatably connected to the second rotating assembly, the first rotating assembly is provided with a first through hole, the second rotating assembly is provided with a second through hole, wherein the first through hole is in communication with the second through hole and an axis of the first through hole and an axis of the second through hole are both intersected with a target rotary shaft, the target rotary shaft being a rotary shaft between the first rotating assembly and the second rotating assembly, and the first through hole and the second through hole are configured to accommodate a flexible circuit board of the electronic device.

In some embodiments, the first rotating assembly includes a first plate body and a first protrusion structure, wherein a first face of the first plate body is fixedly connected to the first protrusion structure, a second face of the first plate body is fixedly connected to the first body, the first through hole penetrates through the first protrusion structure and the first plate body, and the axis of the first through hole is perpendicular to the second face of the first plate body.

In some embodiments, the second rotating assembly includes a second plate body and a second protrusion structure, wherein a first face of the second plate body is fixedly connected to the second protrusion structure and further fixedly connected to the second body, the second through hole is disposed in the second protrusion structure, and the axis of the second through hole is perpendicular to a second face of the second plate body.

The second plate body is provided with a third through hole, a side of the second protrusion structure proximal to the second plate body is provided with a first groove in communication with both the third through hole and the second through hole, the first protrusion structure penetrates through the third through hole and is disposed in the first groove, and the first protrusion structure is rotatably connected to the second protrusion structure.

In some embodiments, the first face of the first plate body includes a first planar surface and a second planar surface.

An angle formed by a side of the first planar surface proximal to the second face of the first plate body and a side of the second planar surface proximal to the second face of the first plate body is an obtuse angle.

In some embodiments, an intersection line of the first planar surface and the second planar surface is in contact with the second face of the second plate body.

In some embodiments, the intersection line of the first planar surface and the second planar surface is parallel to an axis of the first protrusion structure.

In some embodiments, the first protrusion structure is provided with a connection hole, an axis of the connection hole is parallel to the target rotary shaft, the second protrusion structure is provided with a fourth through hole, and an axis of the fourth through hole is parallel to the target rotary shaft. The rotary shaft mechanism further includes a first connection piece.

The first connection piece is connected to the connection hole by penetrating through the fourth through hole.

In some embodiments, the second protrusion structure is provided with a second groove, and the fourth through hole is disposed in the second groove; one end of the first connection piece is disposed in the second groove, and the other end of the first connection piece is connected to the connection hole by penetrating through the fourth through hole.

In some embodiments, the first connection piece is a pin.

In some embodiments, the rotary shaft mechanism further includes a sealing member.

The sealing member is disposed between the first rotating assembly and the second rotating assembly, and is provided with a fifth through hole. The fifth through hole is in communication with both the first through hole and the second through hole, and configured to accommodate the flexible circuit board.

In some embodiments, the fifth through hole is a through hole provided with an opening.

In some embodiments, the sealing member is disposed in the first groove of the second protrusion structure of the second rotating assembly, and disposed on a side of the first protrusion structure of the first rotating assembly distal from the first plate body of the first rotating assembly.

In some embodiments, the side of the first protrusion structure distal from the first plate body is arc-shaped, and a face of the sealing member proximal to the first protrusion structure is an arc face.

In some embodiments, the sealing member is made of a flexible material.

In some embodiments, the rotary shaft mechanism further includes an annular second connection piece and an annular third connection piece.

A first face of the second connection piece is bonded to the first rotating assembly, and a second face of the second connection piece is used for bonding with the first body.

A first face of the third connection piece is bonded to the second rotating assembly, and a second face of the third connection piece is used for bonding with the second body.

The first face of the second connection piece and the second face of the second connection piece are two opposite faces, and the first face of the third connection piece and the second face of the third connection piece are two opposite faces.

In some embodiments, the second connection piece and the third connection piece are both made of a foam.

In another aspect, embodiments of the present disclosure provide a device body of an electronic device. The device body includes a first body, a second body, and a rotary shaft mechanism.

The rotary shaft mechanism includes: a first rotating assembly, disposed in the first body and fixedly connected to the first body; and a second rotating assembly, disposed in the second body and fixedly connected to the second body.

The first rotating assembly is rotatably connected to the second rotating assembly, the first rotating assembly is provided with a first through hole, the second rotating assembly is provided with a second through hole, wherein the first through hole is in communication with the second through hole and an axis of the first through hole and an axis of the second through hole are both intersected with a target rotary shaft, the target rotary shaft being a rotary shaft between the first rotating assembly and the second rotating assembly, and the first through hole and the second through hole are configured to accommodate a flexible circuit board of the electronic device.

The first body and the second body are rotatably connected by the rotary shaft mechanism.

In some embodiments, the first body includes a hollow first housing and a first annular boss disposed in the first housing, and the first rotating assembly of the rotary shaft mechanism is disposed in the first housing and fixedly connected to an end face of the first annular boss, wherein an axis of the first annular boss is parallel to the axis of the first through hole.

The second body includes a hollow second housing and a second annular boss disposed in the second housing, and the second rotating assembly of the rotary shaft mechanism is disposed in the second housing and fixedly connected to an end face of the second annular boss, wherein an axis of the second annular boss is parallel to the axis of the second through hole.

In still another aspect, embodiments of the present disclosure provide an electronic device. The electronic device includes a first body, a second body, an electronic element, an external circuit board, a flexible circuit board, and a rotary shaft mechanism.

The rotary shaft mechanism includes: a first rotating assembly, disposed in the first body and fixedly connected to the first body; and a second rotating assembly, disposed in the second body and fixedly connected to the second body.

The first rotating assembly is rotatably connected to the second rotating assembly, the first rotating assembly is provided with a first through hole, the second rotating assembly is provided with a second through hole, wherein the first through hole is in communication with the second through hole and an axis of the first through hole and an axis of the second through hole are both intersected with a target rotary shaft, the target rotary shaft being a rotary shaft between the first rotating assembly and the second rotating assembly.

The first body and the second body are rotatably connected by the rotary shaft mechanism, the electronic element is disposed in the first body, the external circuit board is disposed in the second body, one end of the flexible circuit board is connected to the electronic element, and the other end of the flexible circuit board is connected to the external circuit board by penetrating through the first through hole of the first rotating assembly and the second through hole of the second rotating assembly.

In some embodiments, the electronic device is a wearable device which further includes a display screen.

The first body is a housing configured to package the display screen, and the second body is a temple of the wearable device.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and persons of ordinary skill in the art may still derive other drawings from these accompanying drawings without creative efforts.

DETAILED DESCRIPTION

For clearer descriptions of the objectives, technical solutions, and advantages of the present disclosure, embodiments of the present disclosure are described in detail hereinafter with reference to the accompanying drawings.

Figure 1:
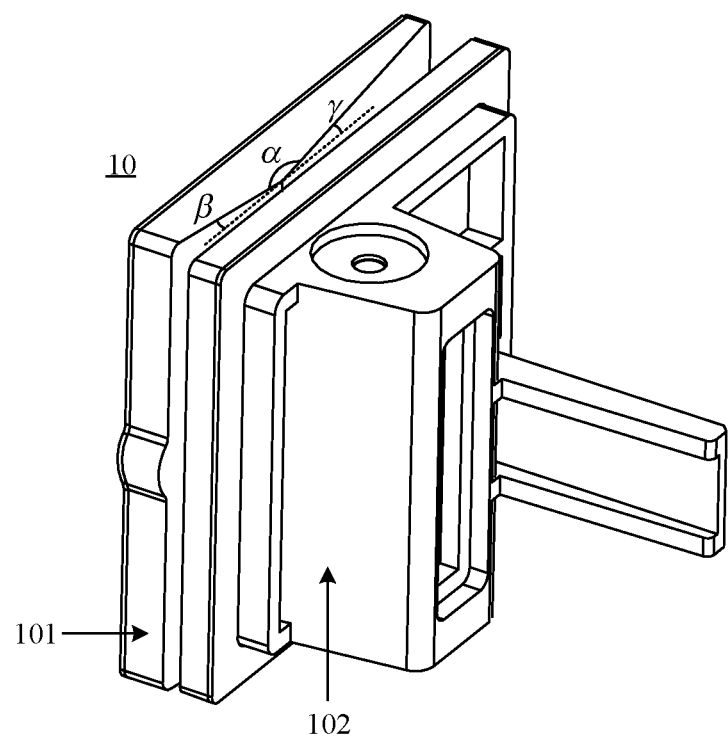
FIG. 1 is a schematic structural view of a rotary shaft mechanism of an electronic device according to an embodiment of the present disclosure.

FIG. 1 is a schematic structural view of a rotary shaft mechanism of an electronic device according to an embodiment of the present disclosure. With reference to FIG. 1, the rotary shaft mechanism 10 includes a first rotating assembly 101 and a second rotating assembly 102.

The first rotating assembly 101 is disposed in a first body of the electronic device, and fixedly connected to the first body. The second rotating assembly 102 may be disposed in a second body of the electronic device, and fixedly connected to the second body. Further, the first rotating assembly 101 is rotatably connected to the second rotating assembly 102 to realize relative rotation of the first body and the second body of the electronic device.

Figure 2:
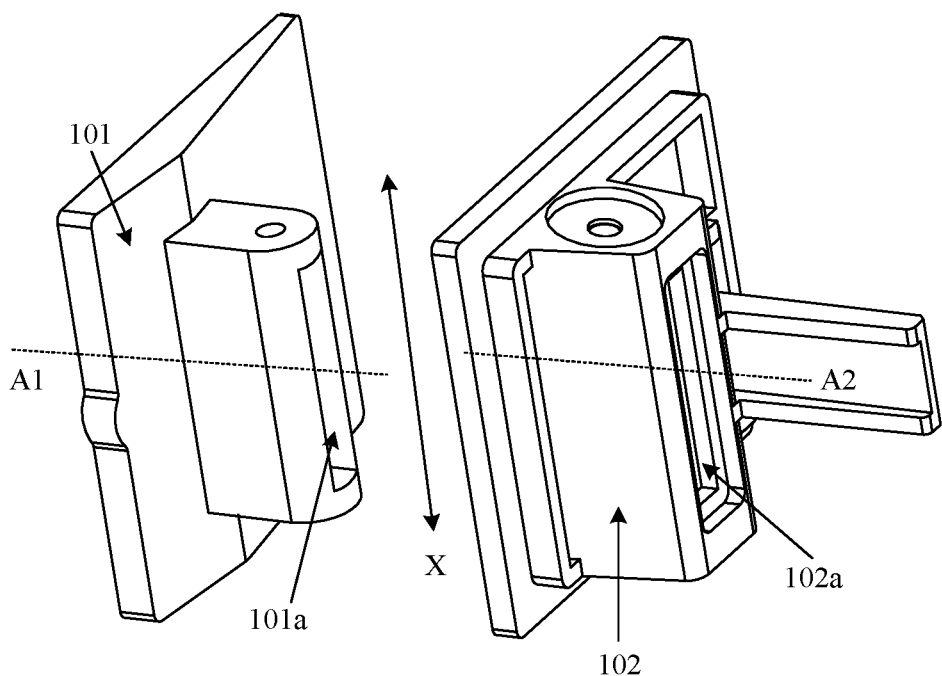
FIG. 2 is an exploded view of the rotary shaft mechanism shown in FIG. 1.
Figure 3:
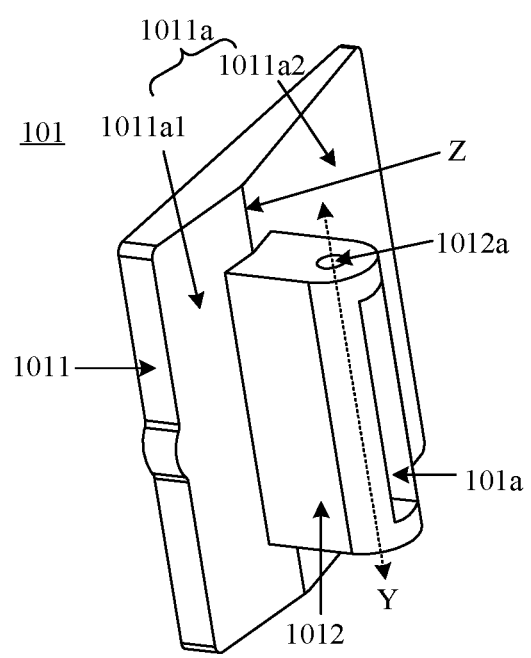
FIG. 3 is a schematic structural view of a first rotating assembly according to an embodiment of the present disclosure.
Figure 4:
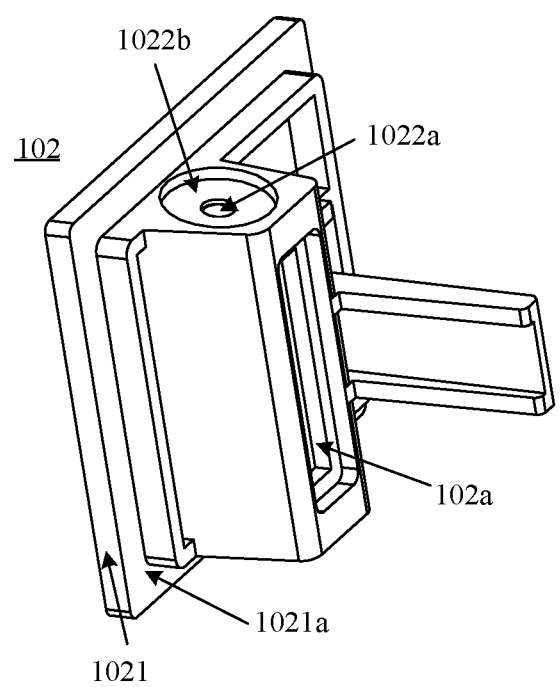
FIG. 4 is a schematic structural view of a second rotating assembly according to an embodiment of the present disclosure.

FIG. 2 is an exploded view of the rotary shaft mechanism shown in FIG. 1. FIG. 3 is a schematic structural view of a first rotating assembly according to an embodiment of the present disclosure. In combination with FIG. 2 and FIG. 3, the first rotating assembly 101 is provided with a first through hole 101a. FIG. 4 is a schematic structural view of a second rotating assembly according to an embodiment of the present disclosure. In combination with FIG. 2 and FIG. 4, the second rotating assembly 102 is provided with a second through hole 102a.

In combination with FIG. 1 to FIG. 4, the first through hole 101a is in communication with the second through hole 102a, and an axis A1 of the first through hole 101a and an axis A2 of the second through hole 102a are both intersected with a target rotary shaft X. The target rotary shaft X is a rotary shaft between the first rotating assembly 101 and the second rotating assembly 102. Illustratively, the axis A1 of the first through hole 101a and the axis A2 of the second through hole 102a may be both perpendicular to the target rotary shaft X.

Figure 5:
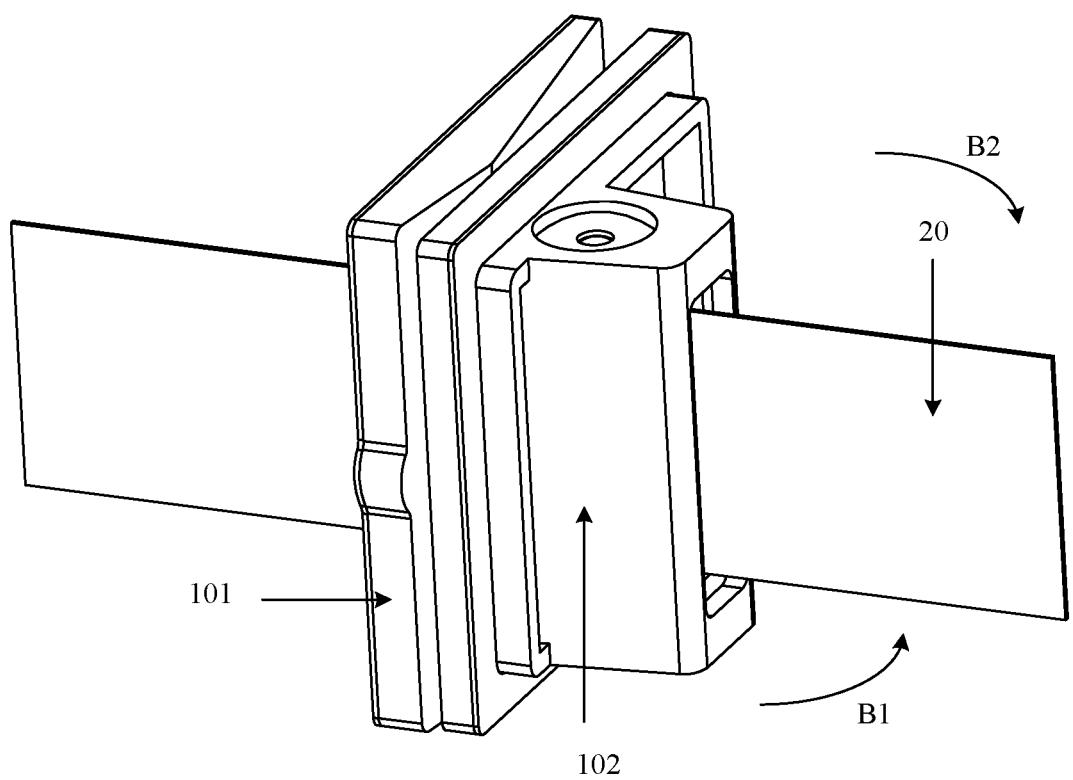
FIG. 5 is a schematic structural view of a rotary shaft mechanism and a flexible circuit board according to an embodiment of the present disclosure.

With reference to FIG. 5, the first through hole 101a and the second through hole 102a are configured to accommodate a flexible circuit board 20 of the electronic device. That is, the flexible circuit board 20 of the electronic device may be disposed in the first through hole 101a and the second through hole 102a, such that the flexible circuit board 20 is prevented from being damaged, and thus the electronic device is highly reliable. Further, the flexible circuit board 20 is disposed inside the rotary shaft mechanism 10, and thus a good aesthetic appearance is achieved.

In summary, the embodiments of the present disclosure provide a rotary shaft mechanism of an electronic device. In the rotary shaft mechanism, the first rotating assembly has the first through hole, and the second rotating assembly has the second through hole. The flexible circuit board of the electronic device is disposed in the first through hole and the second through hole, such that the first rotating assembly and the second rotating assembly can protect the flexible circuit board and prevent the flexible circuit board from being damaged, and thus the electronic device is highly reliable. Further, the flexible circuit board is disposed inside the rotary shaft mechanism, and thus a good aesthetic appearance is achieved.

Figure 6:
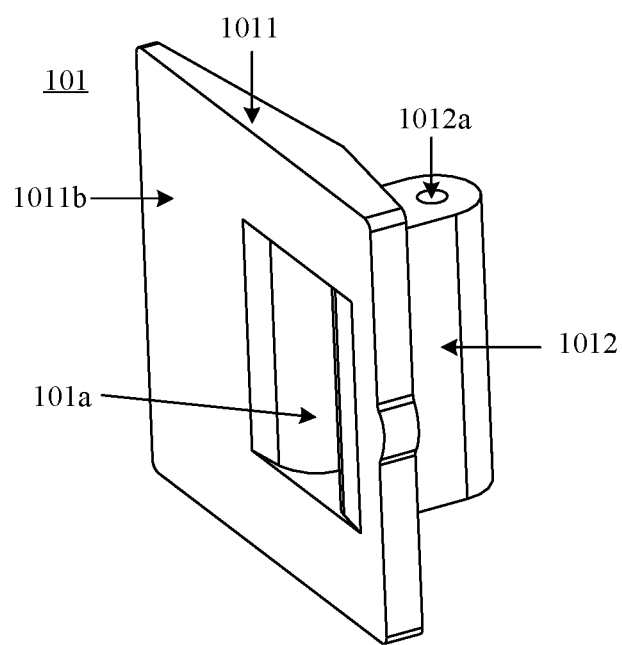
FIG. 6 is a schematic structural view of another first rotating assembly according to an embodiment of the present disclosure.

In combination with FIG. 3 and FIG. 6, the first rotating assembly 101 may include a first plate body 1011 and a first protrusion structure 1012. A first face 1011a of the first plate body 1011 may be fixedly connected to the first protrusion structure 1012. A second face 1011b of the first plate body 1011 may be fixedly connected to the first body of the electronic device. The first through hole 101a may penetrate through the first protrusion structure 1012 and the first plate body 1011, and the axis A1 of the first through hole 101a may be perpendicular to the second face 1011b of the first plate body 1011.

The first through hole 101a penetrates through the first protrusion structure 1012 and the first plate body 1011. One end of the flexible circuit board 20 of the electronic device may penetrate through the first through hole 101a, and may be disposed on a side of the first plate body 1011 distal from the first protrusion structure 1012. The other end of the flexible circuit board 20 may be disposed on a side of the first protrusion structure 1012 distal from the first plate body 1011. That is, both ends of the flexible circuit board 20 may be disposed on both sides of the first rotating assembly 101 respectively.

Figure 7:
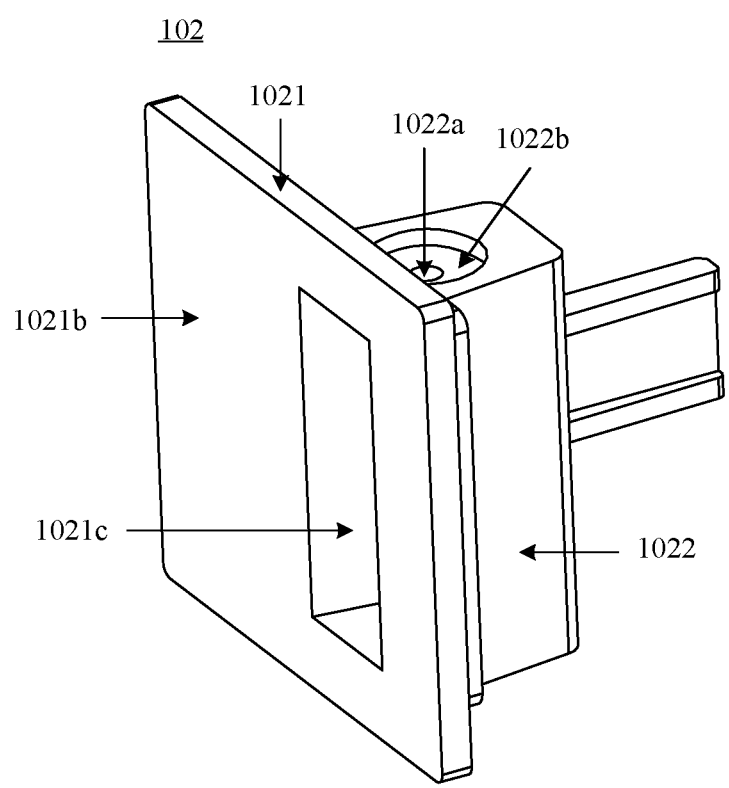
FIG. 7 is a schematic structural view of another second rotating assembly according to an embodiment of the present disclosure.

In combination with FIG. 4 and FIG. 7, the second rotating assembly 102 may include a second plate body 1021 and a second protrusion structure 1022. A first face 1021a of the second plate body 1021 may be fixedly connected to the second protrusion structure 1022, and may be further fixedly connected to the second body of the electronic device. The second through hole 102a may be disposed in the second protrusion structure 1022, and the axis A2 of the second through hole 102a may be perpendicular to a second face 1021b of the second plate body 1021.

With reference to FIG. 7, the second plate body 1021 may be provided with a third through hole 1021c. A side of the second protrusion structure 1022 proximal to the second plate body 1021 is provided with a first groove (not shown) in communication with the third through hole 1021c and the second through hole 102a respectively. The first protrusion structure 1012 of the first rotating assembly 101 may penetrate through the third through hole 1021c, and may be disposed in the first groove. Further, the first protrusion structure 1012 is rotatably connected to the second protrusion structure 1022 to implement rotatable connection of the first rotating assembly 101 and the second rotating assembly 102.

Since the first protrusion structure 1012 is disposed in the first groove of the second protrusion structure 1022, the first groove is in communication with the first through hole 101a of the first protrusion structure 1012. Further, since the first groove is also in communication with the second through hole 102a, the first through hole 101a and the second through hole 102a may be in communication with the first groove through the second protrusion structure 1022. Therefore, one end of the flexible circuit board 20 of the electronic device may penetrate through the second through hole 102a and the first through hole 101a sequentially, and may be disposed on a side of the first rotating assembly 101 distal from the second rotating assembly 102. The other end of the flexible circuit board 20 may be disposed on a side of the second rotating assembly 102 distal from the first rotating assembly 101. That is, both ends of the flexible circuit board 20 may be disposed on both sides of the first rotating assembly 101 and the rotating assembly 102 respectively.

With reference to FIG. 3, the first face 1011a of the first plate body 1011 may include a first planar surface 1011a1 and a second planar surface 1011a2. In combination with FIG. 1 and FIG. 3, an angle α formed by a side of the first planar surface 1011a1 proximal to the second face 1011b of the first plate body 1011 and a side of the second planar surface 1011a2 proximal to the second face 1011b of the first plate body 1011 is an obtuse angle. Therefore, the relative rotation between the first rotating assembly 101 and the second rotating assembly 102 is facilitated, and reliability of the rotation of the first rotating assembly 101 and the second rotating assembly 102 is ensured.

In embodiments of the present disclosure, when the first protrusion structure 1012 penetrates through the third through hole 1021c of the second plate body 1021 and is disposed in the first groove of the second protrusion structure 1022, the first face 1011a of the first plate body 1011 is proximal to the second face 1021b of the second plate body 1021 relative to the second face 1011b of the first plate body 1011.

Further, since the angle α formed by the side of the first planar surface 1011a1 proximal to the second face 1011b of the first plate body 1011 and the side of the second planar surface 1011a2 proximal to the second face 1011b of the first plate body 1011 is the obtuse angle, the first planar surface 1011a1 and the second planar surface 1011a2 of the first plate body 1011 are not coplanar. Further, the second face 1021b of the second plate body 1021 may be in contact with an intersection line of the first planar surface 1011a1 and the second planar surface 1011a2, thereby ensuring tightness between the first rotating assembly 101 and the second rotating assembly 102 and preventing moisture or dust from entering the rotary shaft mechanism from a gap between the first plate body 1011 and the second plate body 1021. Therefore, the rotary shaft mechanism is highly reliable.

After the first rotating assembly 101 and the second rotating assembly 102 rotate relatively, the second face 1021b of the second plate body 1021 may be in contact with one of the first planar surface 1011a1 and the second planar surface 1011a2.

In embodiments of the present disclosure, a sum of an angle β formed by the second face 1021b of the second plate body 1021 and the first planar surface 1011a1, an angle γ formed by the second face 1021b of the second plate body 1021 and the first planar surface 1011a1, and the angle α formed by the first planar surface 1011a1 and the second planar surface 1011a2 may be 180 degrees, that is, α+β+γ=180°.

The angle α formed by the first planar surface 1011a1 and the second planar surface 1011a2 may be a fixed value. The angle β formed by the second face 1021b of the second plate body 1021 and the first planar surface 1011a1 and the angle γ formed by the second face 1021b of the second plate body 1021 and the first planar surface 1011a1 may be changed along with the rotation of the first rotating assembly 101 and the second rotating assembly 102.

If the angle α formed by the first planar surface 1011a1 and the second planar surface 1011a2 is 160°, a sum of the angle β formed by the second face 1021b of the second plate body 1021 and the first planar surface 1011a1 and the angle γ formed by the second face 1021b of the second plate body 1021 and the second planar surface 1011a2 may be 20°. If the angle α formed by the first planar surface 1011a1 and the second planar surface 1011a2 is 120°, the sum of the angle β formed by the second face 1021b of the second plate body 1021 and the first planar surface 1011a1 and the angle γ formed by the second face 1021b of the second plate body 1021 and the first planar surface 1011a1 may be 60°.

In the case that the angle α formed by the first planar surface 1011a1 and the second planar surface 1011a2 is 160°, if the second face 1021b of the second plate body 1021 is in contact with the first planar surface 1011a1 (the angle β formed by the second face 1021b of the second plate body 1021 and the first planar surface 1011a1 is 0°), the angle γ formed by the second face 1021b of the second plate body 1021 and the second planar surface 1011a2 is 20°. Optionally, in the case that the angle α formed by the first planar surface 1011a1 and the second planar surface 1011a2 is 160°, if the second face 1021b of the second plate body 1021 is in contact with the second planar surface 1011a2 (the angle γ formed by the second face 1021b of the second plate body 1021 and the second planar surface 1011a2 is 0°), the angle β formed by the second face 1021b of the second plate body 1021 and the first planar surface 1011a1 is 20°.

In embodiments of the present disclosure, the sum of the angle β formed by the second face 1021b of the second plate body 1021 and the first planar surface 1011a1 and the angle γ formed by the second face 1021b of the second plate body 1021 and the second planar surface 1011a2 (β+γ=180°−α) may be referred to as a maximum rotation angle allowable by the rotary shaft mechanism 10. It is thus known that the maximum rotation angle allowable by the rotary shaft mechanism 10 is negatively correlated with the angle α formed by the first planar surface 1011a1 and the second planar surface 1011a2. That is, the larger the angle α formed by the first planar surface 1011a1 and the second planar surface 1011a2 is, the smaller the maximum rotation angle allowable by the rotary shaft mechanism 10 is; the smaller the angle α formed by the first planar surface 1011a1 and the second planar surface 1011a2 is, the larger the maximum rotation angle allowable by the rotary shaft mechanism 10 is.

In some embodiments, the maximum rotation angle allowable by the rotary shaft mechanism 10 may be a sum of a first maximum rotation angle allowable by the second rotating assembly 102 in a first direction B1 relative to the first rotating assembly 101 and a second maximum rotation angle allowable by the second rotating assembly 102 in a second direction B2 relative to the first rotating assembly 101.

The first direction B1 may be a direction of the second face 1021b of the second plate body 1021 that is distal from the first planar surface 1011a1 and proximal to the second planar surface 1011a2. The second direction B2 may be a direction of the second face 1021b of the second plate body 1021 that is distal from the second planar surface 1011a2 and proximal to the first planar surface 1011a1.

In order to ensure symmetry of the rotation of the first rotating assembly 101 and the second rotating assembly 102, the first maximum rotation angle may be equal to the second maximum rotation angle. The first maximum rotation angle may be equal to the angle β formed by the second face 1021*b* of the second plate body 1021 and the first planar surface 1011*a*1 of the first plate body 1011 when the second face 1021*b* of the second plate body 1021 is parallel to the second face 1011*b* of the first plate body 1011. The second maximum rotation angle may be equal to the angle γ formed by the second face 1021*b* of the second plate body 1021 and the second planar surface 1011*a*2 of the first plate body 1011 when the second face 1021*b* of the second plate body 1021 is parallel to the second face 1011*b* of the first plate body 1011.

With reference to FIG. 3, an axis Y of the first protrusion structure 1012 may be parallel to an intersection line Z of the first planar surface 1011*a*1 and the second planar surface 1011*a*2. Therefore, the first protrusion structure 1012 may be made symmetric with respect to the intersection line Z of the first planar surface 1011*a*1 and the second planar surface 1011*a*2 to ensure the structural symmetry of the first rotating assembly 101, thereby ensuring stability of the rotation of the first rotating assembly 101 and the second rotating assembly 102.

Figure 8:
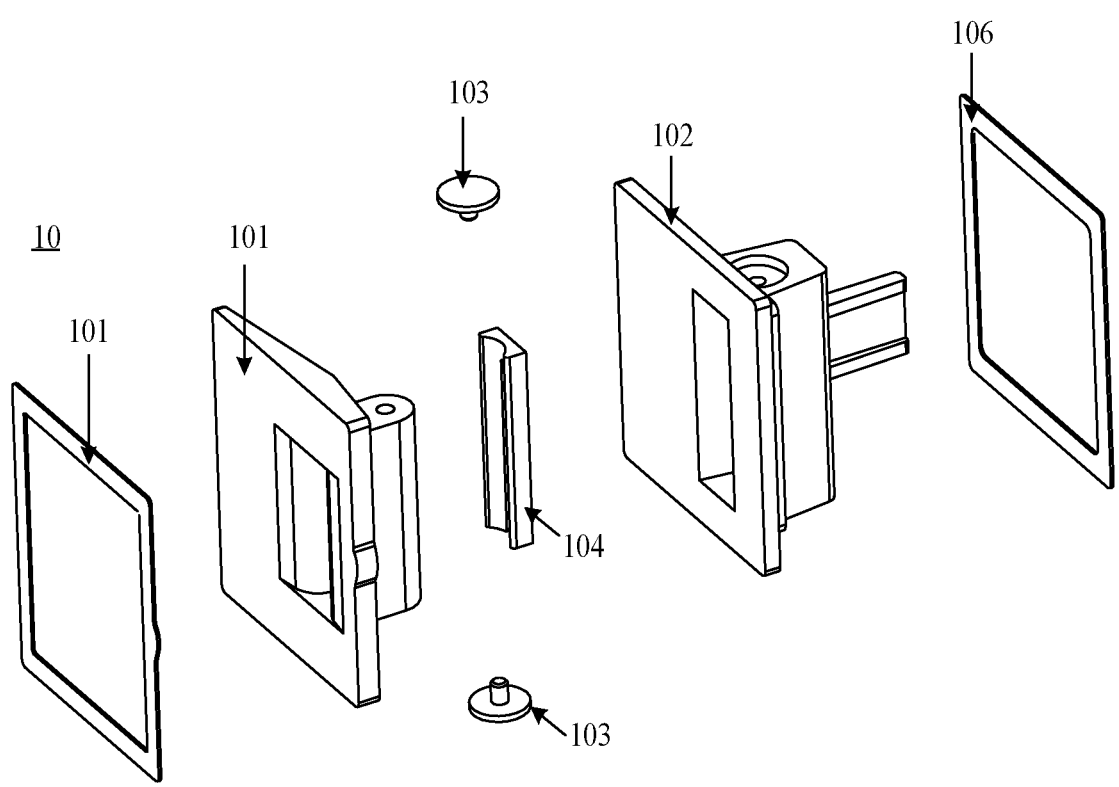
FIG. 8 is a schematic structural view of another rotary shaft mechanism of an electronic device according to an embodiment of the present disclosure.

With reference to FIG. 3 and FIG. 6, the first protrusion structure 1012 may have a connection hole 1012*a*, and an axis of the connection hole 1012*a* may be parallel to the target rotary shaft X. With reference to FIG. 4 and FIG. 7, the second protrusion structure 1022 may have a fourth through hole 1022*a*, and an axis of the fourth through hole 1022*a* may be parallel to the target rotary shaft X. With reference to FIG. 8, the rotary shaft mechanism 10 may further include a first connection piece 103. The first connection piece 103 may be connected to the connection hole 1012*a* by penetrating through the fourth through hole 1022*a*.

Figure 9:
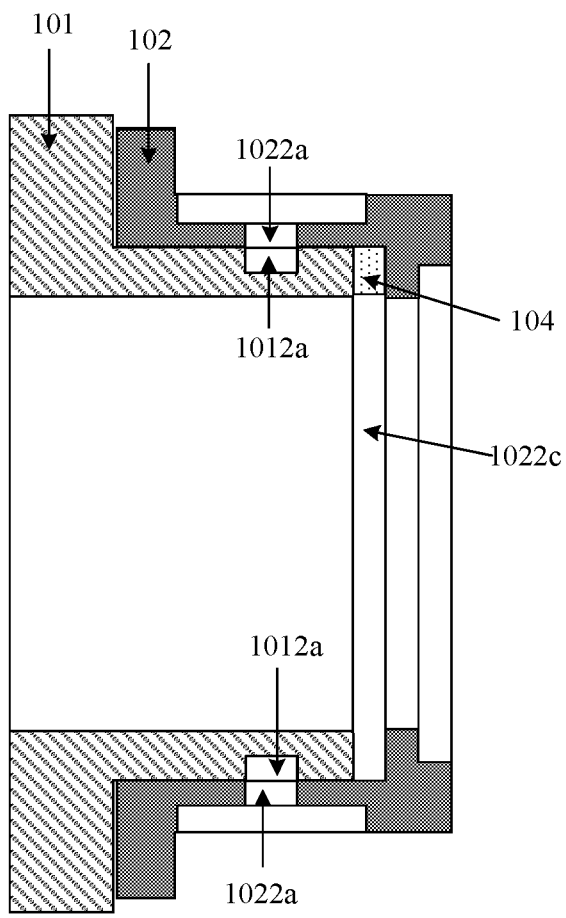
FIG. 9 is partial section view of a first rotating assembly and a second rotating assembly according to an embodiment of the present disclosure.

In embodiments of the present disclosure, FIG. 9 is a partial section view of a first rotating assembly and a second rotating assembly according to an embodiment of the present disclosure. With reference to FIG. 9, the connection hole 1012*a* may be a non-through hole, i.e., a blind hole. Therefore, the first through hole 101*a* disposed on the first protrusion structure 1012 is not in communication with the connection hole 1012*a* disposed on the first protrusion structure 1012, thereby avoiding mutual impact of the first connection piece 103 disposed in the connection hole 1012*a* and the flexible circuit board 20 disposed in the first through hole 101*a* and ensuring the reliability of the rotary shaft mechanism 10. Further, since the first connection piece 103 is to be connected to the connection hole 1012*a* by penetrating through the fourth through hole 1022*a*, the fourth through hole 1022*a* is required to penetrate through the second protrusion structure 1022.

With reference to FIG. 9, the first protrusion structure 1012 may have two connection holes 1012*a*, and the second protrusion structure 1022 may have two fourth through holes 1022*a* in one-to-one correspondence to two connection holes 1012*a*. Correspondingly, with reference to FIG. 10, the rotary shaft mechanism 10 may include two first connection pieces 103. Each first connection piece 103 may be connected to the connection hole 1012*a* corresponding to the fourth through hole 1022*a* by penetrating through one fourth through hole 1022*a*.

With reference to FIG. 4 and FIG. 7, the second protrusion structure 1022 may have a second groove 1022*b*, and the fourth through hole 1022*a* may be disposed in the second groove 1022*b*. One end of the first connection piece 103 may be disposed in the second groove 1022*b*, and the other end of the first connection piece 103 may be connected to the connection hole 1012*a* by penetrating through the fourth through hole 1022*a*.

In some embodiments, the first connection piece 103 may be a pin. Nevertheless, the first connection piece 103 may also be of any other structure, for example, a screw. The first connection piece 103 is not specifically limited in the embodiments of the present disclosure as long as the first connection piece 103 is capable of effectively connecting the first protrusion structure 1012 to the second protrusion structure 1022.

Figure 10:
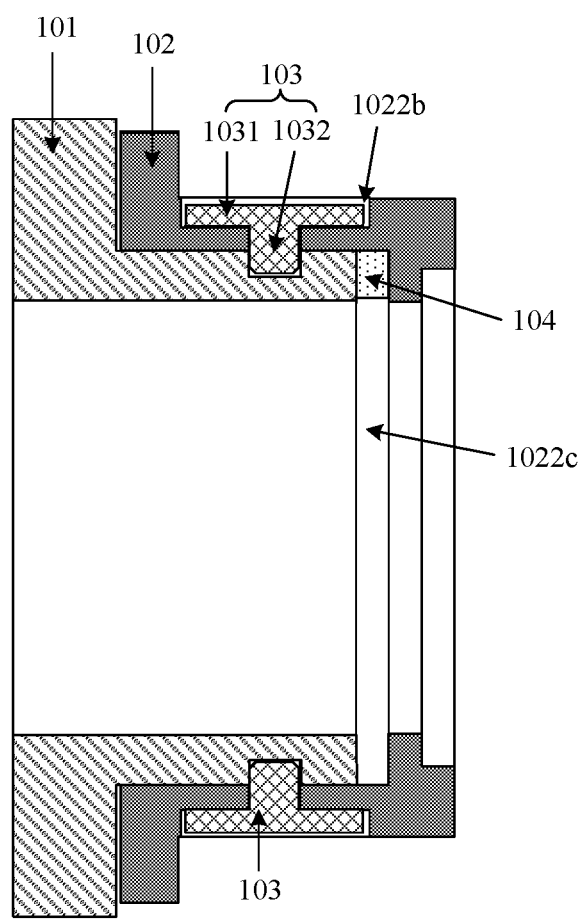
FIG. 10 is partial section view of a first rotating assembly, a second rotating assembly and a first connection piece according to an embodiment of the present disclosure.

With reference to FIG. 10, the first connection piece 103 is a screw. A head portion 1031 of the first connection piece 103 may be disposed in the second groove 1022*b*, and a connection portion 1032 of the first connection piece 103 may be connected to the connection hole 1012*a* by penetrating through the fourth through hole 1022*a*. Therefore, the head portion 1031 of the first connection piece 103 is prevented from protruding from the surface of the second protrusion structure 1022, thereby ensuring flatness of the structure.

With reference to FIG. 8, the rotary shaft mechanism 10 may further include a sealing member 104. The sealing member 104 may be disposed between the first rotating assembly 101 and the second rotating assembly 102. Further, with reference to FIG. 11, the sealing member 104 may have a fifth through hole 104*a*. The fifth through hole 104*a* may be in communication with the first through hole 101*a* and the second through hole 102*a* respectively, and may be configured to accommodate the flexible circuit board 20.

By disposing the sealing member 104 between the first rotating assembly 101 and the second rotating assembly 102, sealability of the rotary shaft mechanism 10 may be improved, and the moisture or dust may be prevented from entering the first body and the second body of the electronic device through the rotary shaft mechanism 10, thereby ensuring quality of the electronic device.

In embodiments of the present disclosure, one end of the flexible circuit board 20 of the electronic device may penetrate through the second through hole 102*a*, the fifth through hole 104*a* and the first through hole 101*a* sequentially, and may be disposed on a side of the first rotating assembly 101 distal from the sealing member 104. The other end of the flexible circuit board 20 may be disposed on a side of the second rotating assembly 102 distal from the sealing member 104.

Figure 11:
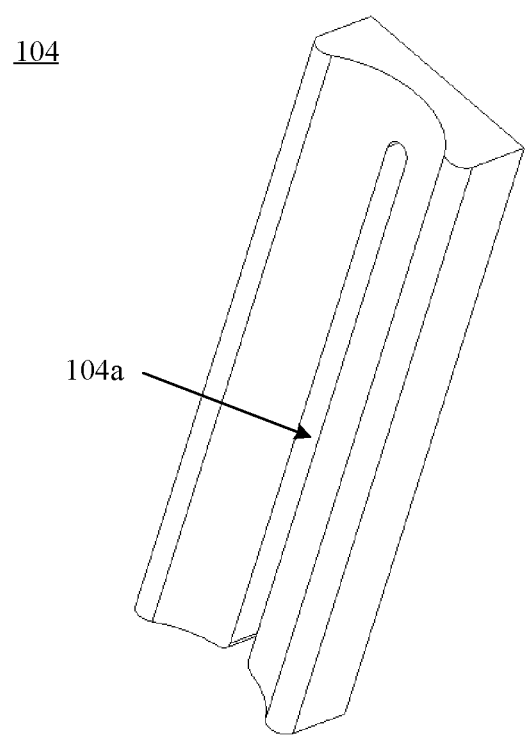
FIG. 11 is a schematic structural view of a sealing member according to an embodiment of the present disclosure.

With reference to FIG. 11, the fifth through hole 104*a* may be a through hole with an opening. Therefore, the flexible circuit board 20 of the electronic device may be inserted from a side of the fifth through hole 104*a* with the opening and disposed in the fifth through hole 104*a*, thereby facilitating assembly.

With reference to FIG. 9 and FIG. 10, the sealing member 104 may be disposed in the first groove 1022*c* of the second protrusion structure 1022 of the second rotating assembly 102, and disposed on a side of the first protrusion structure 1012 distal from the first plate body 1011.

Figure 12:
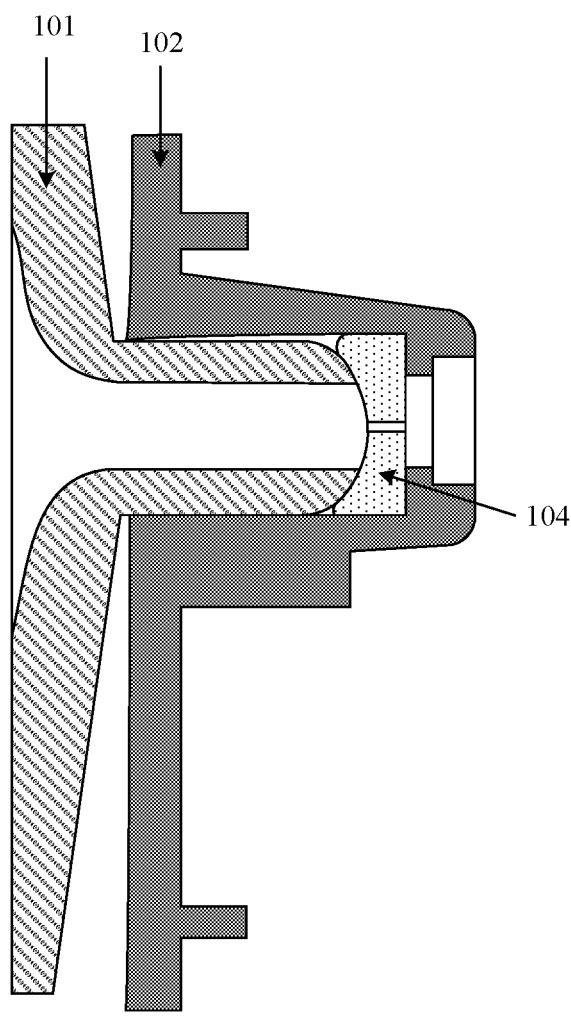
FIG. 12 is partial section view of another first rotating assembly, another second rotating assembly and another first connection piece according to an embodiment of the present disclosure.

With reference to FIG. 3, a side of the first protrusion structure 1012 distal from the first plate body 1011 is arc-shaped. In combination with FIG. 11 and FIG. 12, a face of the sealing member 104 proximal to the first protrusion structure 1012 is an arc face, and a face of the sealing member 104 distal from the first protrusion structure 1012 is a flat face. When the first rotating assembly 101 and the second rotating assembly 102 rotate relatively, a side of the first protrusion structure 1012 distal from the first plate body 1011 may rotate relative to the arc face of the sealing member 104. Further, when the first protrusion structure 1012 rotates relative to the sealing member 104, a side of the first protrusion structure 1012 distal from the first plate body 1011 is always in contact with the arc face of the sealing member 104, thereby ensuring the sealability of the rotary shaft mechanism 10.

In some embodiments, the sealing member 104 may be made of a flexible material. The sealing member 104 may provide resistance for the relative rotation of the first rotating assembly 101 and the second rotating assembly 102 relying on flexibility and sealability of its material, thereby facilitating positioning after rotation. Illustratively, the sealing member 104 may be made of rubber.

With reference to FIG. 8, the rotary shaft mechanism 10 may further include an annular second connection piece 105 and an annular third connection piece 106.

A first face of the second connection piece 105 may be bonded to the first rotating assembly 101, and a second face of the second connection piece 105 may be used for bonding with the first body in the electronic device. That is, the first rotating assembly 101 and the first body may be connected by the second connection piece 105. The first face of the second connection piece 105 and the second face of the second connection piece 105 may be two opposite faces.

Optionally, the first face of the second connection piece 105 may be bonded to the second face 1011b of the first plate body 1011 in the first rotating assembly 101.

A first face of the third connection piece 106 may be bonded to the second rotating assembly 102, and a second face of the third connection piece 106 may be used for bonding with the second body in the electronic device. That is, the second rotating assembly 102 and the second body may be connected by the third connection piece 106. The first face of the third connection piece 106 and the second face of the third connection piece 106 may be two opposite faces.

In some embodiments, the first face of the third connection piece 106 may be bonded to the first face 1021a of the second plate body 1021 in the second rotating assembly 102.

In embodiments of the present disclosure, the second connection piece 105 and the third connection piece 106 may be both made of a foam. Therefore, the moisture or dust may be prevented from entering the first body and the second body of the electronic device, thereby avoiding corrosion of components disposed in the first body and the second body and ensuring the quality of the electronic device.

In summary, the embodiments of the present disclosure provide a rotary shaft mechanism of an electronic device. In the rotary shaft mechanism, the first rotating assembly has the first through hole, and the second rotating assembly has the second through hole. The flexible circuit board of the electronic device is disposed in the first through hole and the second through hole, such that the first rotating assembly and the second rotating assembly can protect the flexible circuit board and prevent the flexible circuit board from being damaged, and the electronic device is highly, which achieves a good aesthetic appearance.

Figure 13:
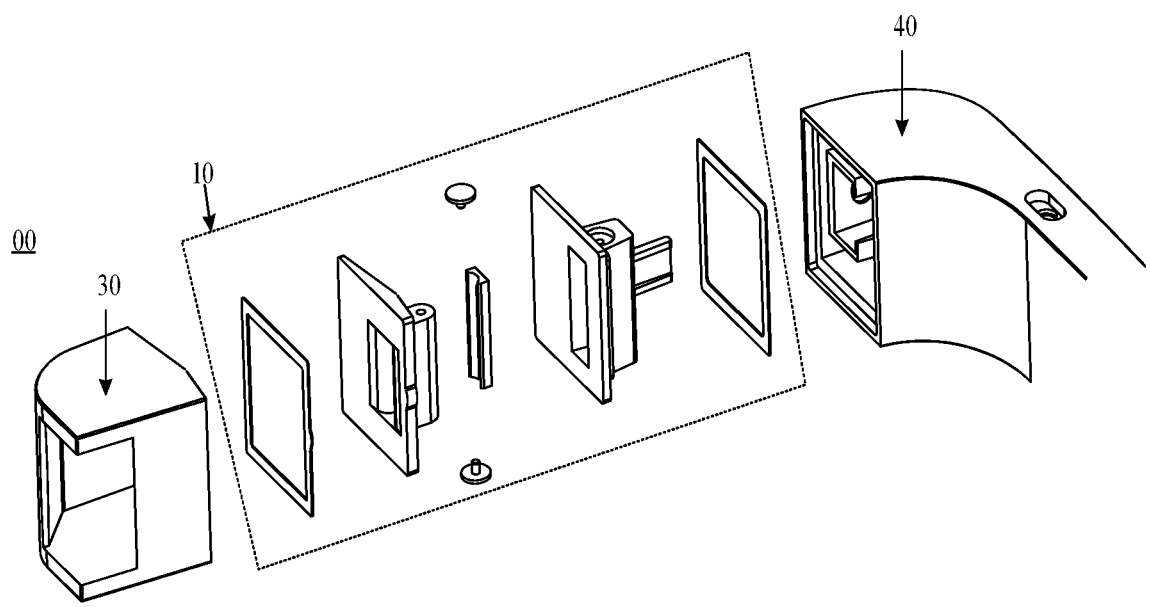
FIG. 13 is a schematic structural view of a device body of an electronic device according to an embodiment of the present disclosure.

FIG. 13 is a schematic structural view of a device body of an electronic device according to an embodiment of the present disclosure. With reference to FIG. 13, the device body 00 may include a first body 30, a second body 40, and the rotary shaft mechanism 10 according to the above embodiment.

The rotary shaft mechanism 10 includes a first rotating assembly 101 and a second rotating assembly 102. The first rotating assembly 101 is disposed in the first body 30, and fixedly connected to the first body 30. The second rotating assembly 102 may be disposed in the second body 40, and fixedly connected to the second body 40. Further, the first rotating assembly 101 and the second rotating assembly 102 are rotatably connected to realize relative rotation of the first body 30 and the second body 40 of the electronic device. That is, the first body 30 and the second body 40 may realize rotatable connection by the rotary shaft mechanism 10.

In embodiments of the present disclosure, the first rotating assembly 101 is provided with a first through hole 101a. In combination with FIG. 2 and FIG. 4, the second rotating assembly 102 is provided with a second through hole 102a. In combination with FIG. 1 to FIG. 4, the first through hole 101a is in communication with the second through hole 102a, and an axis A1 of the first through hole 101a and an axis A2 of the second through hole 102a are both intersected with a target rotary shaft X. The target rotary shaft X is a rotary shaft between the first rotating assembly 101 and the second rotating assembly 102. Illustratively, the axis A1 of the first through hole 101a and the axis A2 of the second through hole 102a may be both perpendicular to the target rotary shaft X.

With reference to FIG. 5, the first through hole 101a and the second through hole 102a are configured to accommodate a flexible circuit board 20 of the electronic device. That is, the flexible circuit board 20 of the electronic device may be disposed in the first through hole 101a and the second through hole 102a to prevent the flexible circuit board 20 from being damaged, such that the electronic device is highly reliable. Further, the flexible circuit board 20 is disposed inside the rotary shaft mechanism 10, and thus a good aesthetic appearance is achieved.

In summary, the embodiments of the present disclosure provide a device body of an electronic device. In the rotary shaft mechanism included in the device body, the first rotating assembly has the first through hole, and the second rotating assembly has the second through hole. The flexible circuit board of the electronic device is disposed in the first through hole and the second through hole, such that the first rotating assembly and the second rotating assembly can protect the flexible circuit board and prevent the flexible circuit board from being damaged, and the electronic device is highly reliable. Further, the flexible circuit board is disposed inside the rotary shaft mechanism, and thus a good aesthetic appearance is achieved.

Figure 14:
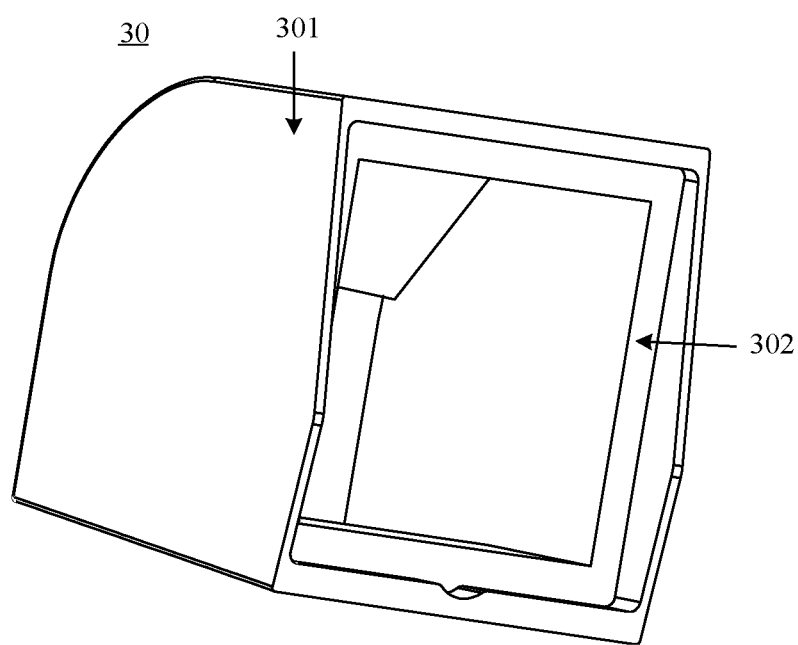
FIG. 14 is a schematic structural view of a first body according to an embodiment of the present disclosure.

FIG. 14 is a schematic structural view of a first body according to an embodiment of the present disclosure. With reference to FIG. 14, the first body 30 may include a hollow first housing 301 and a first annular boss 302 disposed in the first housing 301. The first rotating assembly 101 of the rotary shaft mechanism 10 may be disposed in the first housing 301 and fixedly connected to an end face of the first annular boss 302. An axis of the first annular boss 302 may be parallel to the axis of the first through hole 101a of the first rotating assembly 101.

In some embodiments, the second face of the second connection piece 105 in the first rotating assembly 101 may be bonded to the end face of the first annular boss 302.

Figure 15:
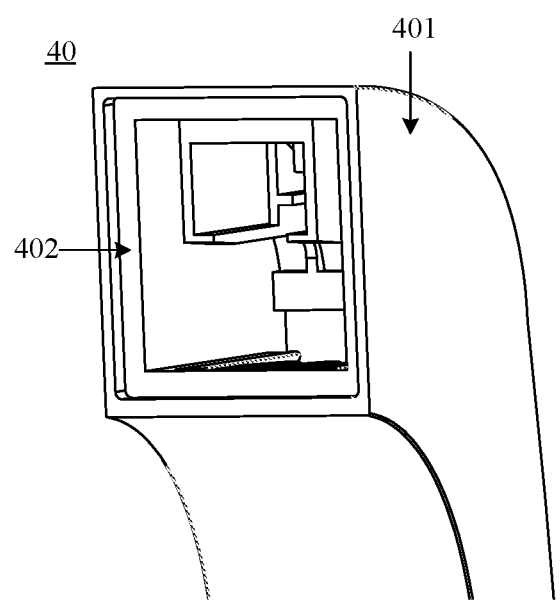
FIG. 15 is a schematic structural view of a second body according to an embodiment of the present disclosure.

FIG. 15 is a schematic structural view of a second body according to an embodiment of the present disclosure. With reference to FIG. 15, the second body 40 may include a hollow second housing 401 and a second annular boss 402 disposed in the second housing 401. The second rotating assembly 102 of the rotary shaft mechanism 10 may be disposed in the second housing 401 and fixedly connected to an end face of the second annular boss 402. An axis of the second annular boss 402 may be parallel to the axis of the second through hole 102a of the second rotating assembly 102.

In some embodiments, the second face of the third connection piece 106 in the second rotating assembly 102 may be bonded to the end face of the second annular boss 402.

In summary, the embodiments of the present disclosure provide a device body of an electronic device. In the rotary shaft mechanism included in the device body, the first rotating assembly has the first through hole, and the second rotating assembly has the second through hole. The flexible circuit board of the electronic device is disposed in the first through hole and the second through hole, such that the first rotating assembly and the second rotating assembly can protect the flexible circuit board and prevent the flexible circuit board from being damaged, and the electronic device is highly reliable. Further, the flexible circuit board is disposed inside the rotary shaft mechanism, and thus a good aesthetic appearance is achieved.

Figure 16:
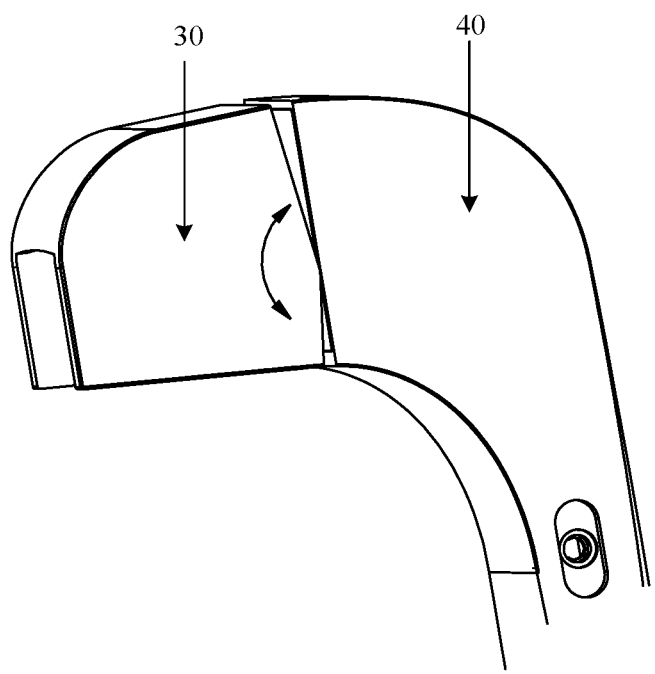
FIG. 16 is a schematic structural view of an electronic device according to an embodiment of the present disclosure.
Figure 17:
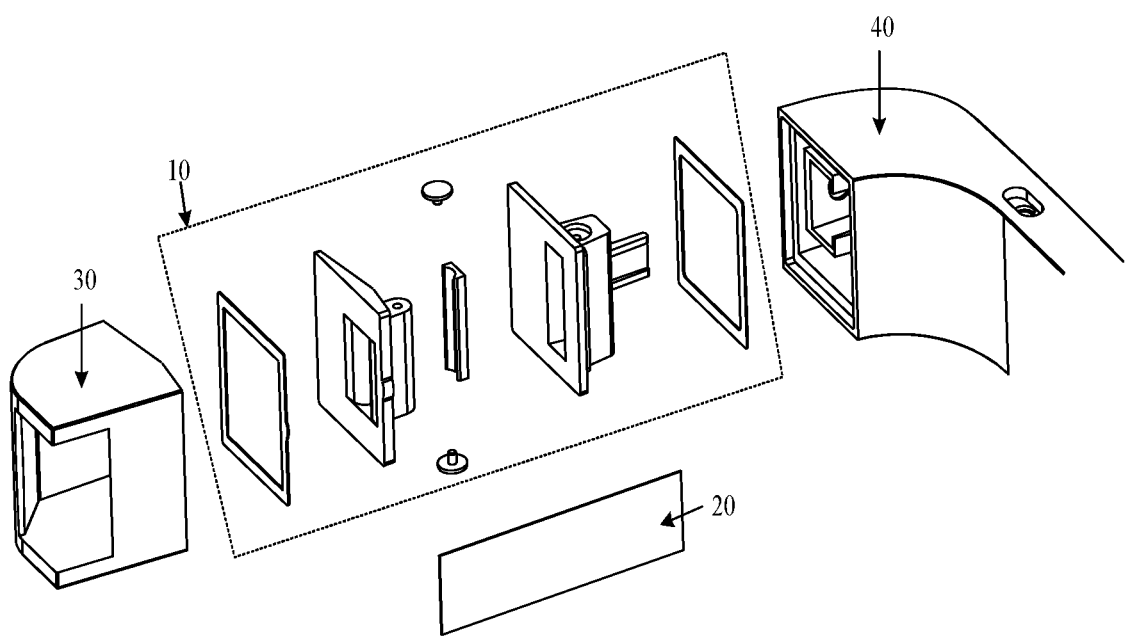
FIG. 17 is an exploded view of the electronic device shown in FIG. 16.

FIG. 16 is a schematic structural view of an electronic device according to an embodiment of the present disclosure. FIG. 17 is an exploded view of the electronic device shown in FIG. 16. In combination with FIG. 16 and FIG. 17, the electronic device may include a first body 30, a second body 40, an electronic element (not shown), an external circuit board (not shown), a flexible circuit board 20 and the rotary shaft mechanism 10 according to the above embodiment.

The first body 30 and the second body 40 may be rotatably connected by the rotary shaft mechanism 10. The electronic element may be disposed in the first body 30, and the external circuit board may be disposed in the second body 40. One end of the flexible circuit board 20 may be connected to the electronic element, and the other end of the flexible circuit board may be connected to the external circuit board by penetrating through the first through hole 101a of the first rotating assembly 101 and the second through hole 102a of the second rotating assembly 102. Therefore, signal transmission between the external circuit board and the electronic element may be realized.

Figure 18:
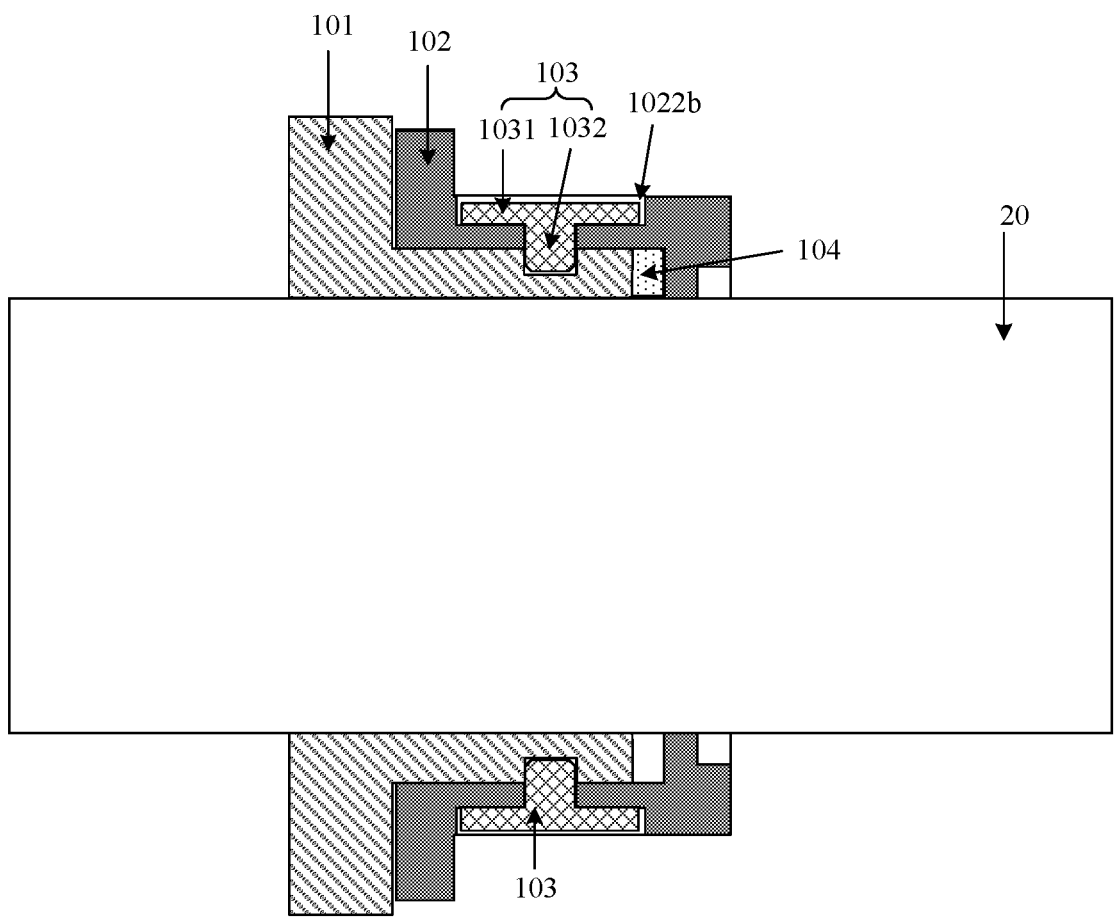
FIG. 18 is a partial section view of a rotary shaft mechanism and a flexible circuit board according to an embodiment of the present disclosure.
Figure 19:
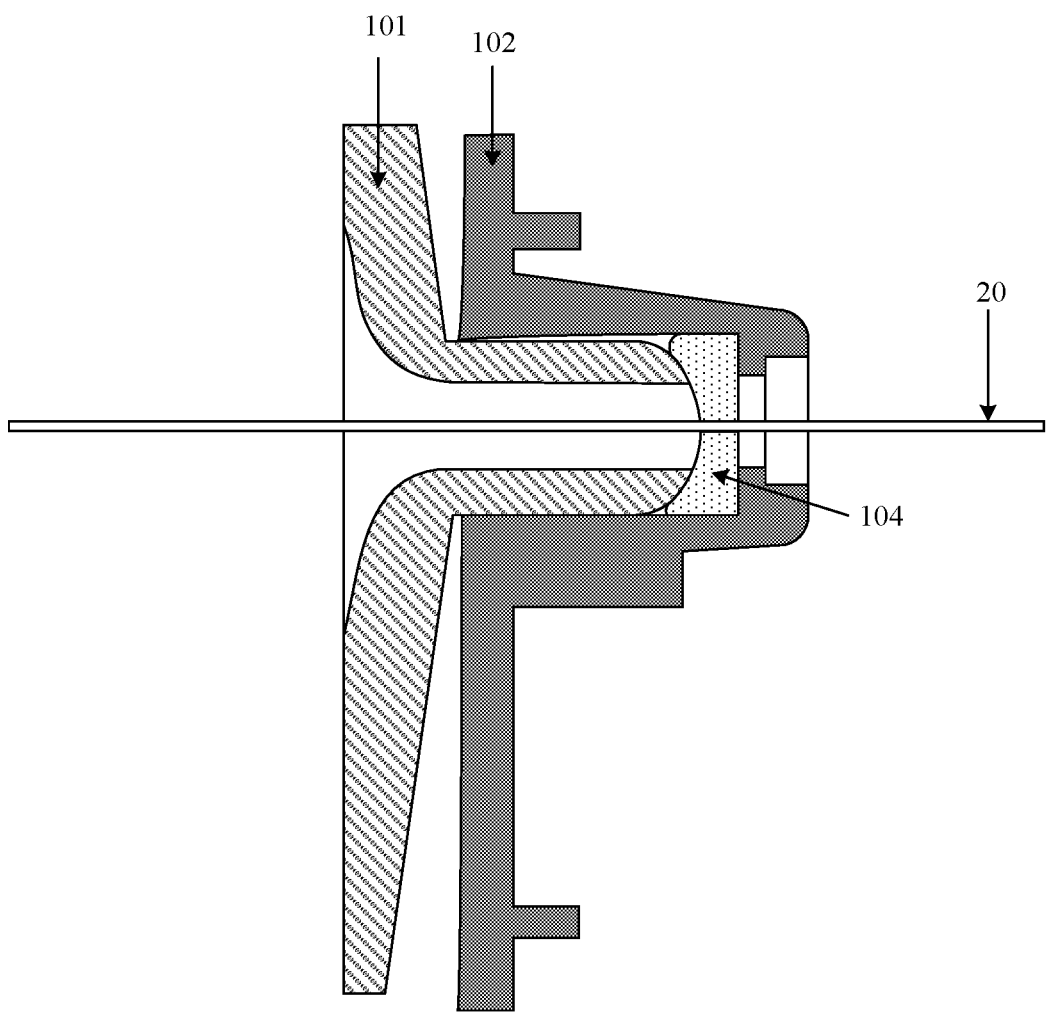
FIG. 19 is a partial section view of another rotary shaft mechanism and a flexible circuit board according to an embodiment of the present disclosure.

With reference to FIG. 5, FIG. 18, and FIG. 19, both ends of the flexible circuit board 20 may be disposed on both sides of the first rotating assembly 101 and the second rotating assembly 102 respectively.

In summary, the embodiments of the present disclosure provide an electronic device. The flexible circuit board in the electronic device may be disposed in the first through hole of the first rotating assembly and the second through hole of the second rotating assembly in the rotary shaft mechanism. Therefore, the first rotating assembly and the second rotating assembly can protect the flexible circuit board and prevent the flexible circuit board from being damaged, and the electronic device is highly reliable. Further, the flexible circuit board is disposed inside the rotary shaft mechanism, and thus a good aesthetic appearance is achieved.

In embodiments of the present disclosure, the rotary shaft mechanism 10, the flexible circuit board 20, the first body 30 and the second body 40 may be assembled by the following process.

In process 1, the flexible circuit board 20 is inserted into the fifth through hole 104a of the sealing member 104, such that both ends of the flexible circuit board 20 are disposed on both sides of the sealing member 104 respectively.

In process 2, a sealant is filled in a gap between the flexible circuit board 20 and the fifth through hole 104a in the sealing member 104, such that the flexible circuit board 20 and the sealing member 104 become an entirety.

In process 3, one end of the flexible circuit board 20 proximal to the flat face of the sealing member 104 is inserted into the second through hole 102a of the second rotating assembly 102, and the sealing member 104 is disposed in the second rotating assembly 102.

In process 4, the other end of the flexible circuit board 20 proximal to the arc face of the sealing member 104 is inserted into the first through hole 101a of the first rotating assembly 101, and an arc-shaped side of the first protrusion structure 1012 of the first rotating assembly 101 is tightly pressed on the arc face of the sealing member 104.

In process 5, the axis of the fourth through hole 1022a of the second protrusion structure 1022 in the second rotating assembly 102 is aligned with the axis of the connection hole 1012a of the first protrusion structure 1012 in the first rotating assembly 101, and the first connection piece 103 is connected to the connection hole 1012a by penetrating through the fourth through hole 1022a.

In process 6, waterproof glue is filled in a gap between the first connection piece 103 and the fourth through hole 1022a and a gap between the first connection piece 103 and the connection hole 1012a, such that the first connection piece 103 and the first rotating assembly 101 and the second rotating assembly 102 become an entirety.

In process 7, the first rotating assembly 101 and the first body 30 are connected by the second connection piece 105.

In process 8, the second rotating assembly 102 and the second body 40 are connected by the third connection piece 106.

Process 8 may be performed before process 7, which is not limited in the embodiments of the present disclosure.

In embodiments of the present disclosure, the electronic device may be a wearable device. Optionally, the wearable device may be an augmented reality (AR) device, or a virtual reality (VR) device.

The wearable device may be a wearable device of glasses, and may further include a display screen. The first body 30 may be a housing configured to package the display screen.

The second body 40 may be a temple of the wearable device.

In summary, the embodiments of the present disclosure provide an electronic device. The flexible circuit board in the electronic device is disposed in the first through hole of the first rotating assembly and the second through hole of the second rotating assembly in the rotary shaft mechanism. Therefore, the first rotating assembly and the second rotating assembly can protect the flexible circuit board and prevent the flexible circuit board from being damaged, and the electronic device is highly reliable. Further, the flexible circuit board is disposed inside the rotary shaft mechanism, and thus a good aesthetic appearance is achieved.

Described above are merely exemplary embodiments of the present disclosure, and are not intended to limit the present disclosure. Within the spirit and principles of the disclosure, any modifications, equivalent substitutions, improvements, and the like are within the protection scope of the present disclosure.

What is claimed is:

1. A rotary shaft mechanism of an electronic device, comprising:
a first rotating assembly, disposed in a first body of the electronic device, and fixedly connected to the first body; and
a second rotating assembly, disposed in a second body of the electronic device, and fixedly connected to the second body;
wherein the first rotating assembly is rotatably connected to the second rotating assembly, the first rotating assembly is provided with a first through hole, and the second rotating assembly is provided with a second through hole, wherein the first through hole is in communication with the second through hole and an axis of the first through hole and an axis of the second through hole are both intersected with a target rotary shaft, the target rotary shaft being a rotary shaft between the first rotating assembly and the second rotating assembly, and the first through hole and the second through hole are configured to accommodate a flexible circuit board of the electronic device.

2. The rotary shaft mechanism according to claim 1, wherein the first rotating assembly comprises a first plate body and a first protrusion structure, wherein a first face of the first plate body is fixedly connected to the first protrusion structure, a second face of the first plate body is fixedly connected to the first body, the first through hole penetrates through the first protrusion structure and the first plate body, and the axis of the first through hole is perpendicular to the second face of the first plate body.

3. The rotary shaft mechanism according to claim 2, wherein the second rotating assembly comprises a second plate body and a second protrusion structure, wherein a first face of the second plate body is fixedly connected to the second protrusion structure and further fixedly connected to the second body, the second through hole is disposed in the second protrusion structure, and the axis of the second through hole is perpendicular to a second face of the second plate body;
wherein the second plate body is provided with a third through hole, a side of the second protrusion structure proximal to the second plate body is provided with a first groove in communication with both the third through hole and the second through hole, the first protrusion structure penetrates through the third through hole and is disposed in the first groove, and the first protrusion structure is rotatably connected to the second protrusion structure.

4. The rotary shaft mechanism according to claim 3, wherein the first face of the first plate body comprises a first planar surface and a second planar surface;
wherein an angle formed by a side of the first planar surface proximal to the second face of the first plate body and a side of the second planar surface proximal to the second face of the first plate body is an obtuse angle.

5. The rotary shaft mechanism according to claim 4, wherein an intersection line of the first planar surface and the second planar surface is in contact with the second face of the second plate body.

6. The rotary shaft mechanism according to claim 4, wherein the intersection line of the first planar surface and the second planar surface is parallel to an axis of the first protrusion structure.

7. The rotary shaft mechanism according to claim 3, wherein the first protrusion structure is provided with a connection hole, an axis of the connection hole is parallel to the target rotary shaft, the second protrusion structure is provided with a fourth through hole, and an axis of the fourth through hole is parallel to the target rotary shaft; and the rotary shaft mechanism further comprises a first connection piece;
wherein the first connection piece is connected to the connection hole by penetrating through the fourth through hole.

8. The rotary shaft mechanism according to claim 7, wherein the second protrusion structure is provided with a second groove, wherein the fourth through hole is disposed in the second groove, one end of the first connection piece is disposed in the second groove, and the other end of the first connection piece is connected to the connection hole by penetrating through the fourth through hole.

9. The rotary shaft mechanism according to claim 7, wherein the first connection piece is a pin.

10. The rotary shaft mechanism according to claim 1, further comprising a sealing member;
wherein the sealing member is disposed between the first rotating assembly and the second rotating assembly and is provided with a fifth through hole, wherein the fifth through hole is in communication with both the first through hole and the second through hole and configured to accommodate the flexible circuit board.

11. The rotary shaft mechanism according to claim 10, wherein the fifth through hole is a through hole provided with an opening.

12. The rotary shaft mechanism according to claim 10, wherein the sealing member is disposed in the first groove of the second protrusion structure of the second rotating assembly, and disposed on a side of the first protrusion structure of the first rotating assembly distal from the first plate body of the first rotating assembly.

13. The rotary shaft mechanism according to claim 12, wherein the side of the first protrusion structure distal from the first plate body is arc-shaped, and a face of the sealing member proximal to the first protrusion structure is an arc face.

14. The rotary shaft mechanism according to claim 13, wherein the sealing member is made of a flexible material.

15. The rotary shaft mechanism according to claim 1, further comprising an annular second connection piece and an annular third connection piece; wherein
a first face of the second connection piece is bonded to the first rotating assembly, and a second face of the second connection piece is bonded to the first body; and
a first face of the third connection piece is bonded to the second rotating assembly, and a second face of the third connection piece is bonded to the second body;
wherein the first face of the second connection piece and the second face of the second connection piece are two opposite faces, and the first face of the third connection piece and the second face of the third connection piece are two opposite faces.

16. The rotary shaft mechanism according to claim 15, wherein the second connection piece and the third connection piece are both made of a foam.

17. A device body of an electronic device, comprising a first body, a second body, and a rotary shaft mechanism; wherein
the rotary shaft mechanism comprises:
a first rotating assembly, disposed in the first body and fixedly connected to the first body; and
a second rotating assembly, disposed in the second body and fixedly connected to the second body;
wherein the first rotating assembly is rotatably connected to the second rotating assembly, the first rotating assembly is provided with a first through hole, and the second rotating assembly is provided with a second through hole, wherein the first through hole is in communication with the second through hole and an axis of the first through hole and an axis of the second through hole are both intersected with a target rotary shaft, the target rotary shaft being a rotary shaft between the first rotating assembly and the second rotating assembly, and the first through hole and the second through hole are configured to accommodate a flexible circuit board of the electronic device; and wherein the first body and the second body are rotatably connected by the rotary shaft mechanism.

18. The device body according to claim 17, wherein
the first body comprises a hollow first housing and a first annular boss disposed in the first housing, and the first rotating assembly of the rotary shaft mechanism is disposed in the first housing and fixedly connected to an end face of the first annular boss, wherein an axis of the first annular boss is parallel to the axis of the first through hole; and the second body comprises a hollow second housing and a second annular boss disposed in the second housing, and the second rotating assembly of the rotary shaft mechanism is disposed in the second housing and fixedly connected to an end face of the second annular boss, wherein an axis of the second annular boss is parallel to the axis of the second through hole.

19. An electronic device, comprising a first body, a second body, an electronic element, an external circuit board, a flexible circuit board, and a rotary shaft mechanism, wherein the rotary shaft mechanism comprises:

a first rotating assembly, disposed in the first body and fixedly connected to the first body; and a second rotating assembly, disposed in the second body and fixedly connected to the second body;

wherein the first rotating assembly is rotatably connected to the second rotating assembly, the first rotating assembly is provided with a first through hole, the second rotating assembly is provided with a second through hole, wherein the first through hole is in communication with the second through hole and an axis of the first through hole and an axis of the second through hole are both intersected with a target rotary shaft, the target rotary shaft being a rotary shaft between the first rotating assembly and the second rotating assembly; and wherein the first body and the second body are rotatably connected by the rotary shaft mechanism, the electronic element is disposed in the first body, the external circuit board is disposed in the second body, one end of the flexible circuit board is connected to the electronic element, and the other end of the flexible circuit board is connected to the external circuit board by penetrating through the first through hole of the first rotating assembly and the second through hole of the second rotating assembly.

20. The electronic device according to claim 19, wherein the electronic device is a wearable device, the wearable device further comprising a display screen;

wherein the first body is a housing configured to package the display screen, and the second body is a temple of the wearable device.

* * * * *